United States Patent [19]

Romankiw

[11] 4,224,361

[45] Sep. 23, 1980

[54] HIGH TEMPERATURE LIFT-OFF TECHNIQUE

[75] Inventor: Lubomyr T. Romankiw, Briarcliff Manor, N.Y.

[73] Assignee: International Business Machines Corporation, Armonk, N.Y.

[21] Appl. No.: 939,926

[22] Filed: Sep. 5, 1978

Related U.S. Application Data

[63] Continuation of Ser. No. 645,852, Dec. 31, 1975, abandoned.

[51] Int. Cl.² ............................................. G03C 5/00
[52] U.S. Cl. .................................. 427/259; 427/98; 427/99; 427/88; 430/314; 430/319; 29/579
[58] Field of Search ..................... 204/14 R, 15, 23; 427/259, 261, 264, 270, 272, 282, 287, 405, 98, 99, 88; 29/579; 96/36.2, 68; 156/656, 661

[56] References Cited

U.S. PATENT DOCUMENTS

| | | | |
|---|---|---|---|
| 2,559,389 | 7/1951 | Beeber et al. | 41/43 |
| 3,157,505 | 11/1974 | Notley | 96/38 |
| 3,462,349 | 8/1969 | Gorgenyi | 204/15 |
| 3,617,373 | 11/1971 | Mott | 427/259 |
| 3,700,510 | 10/1972 | Keene et al. | 156/11 |
| 3,799,777 | 3/1974 | O'Keefe | 96/36.2 |
| 3,849,136 | 11/1974 | Grebe | 96/36.2 |
| 3,943,622 | 3/1976 | Kim et al. | 29/579 |
| 3,982,943 | 9/1976 | Feng | 96/68 |

OTHER PUBLICATIONS

Haddad et al., *IBM Tech. Dis. Bull*, vol. 2. No. 1, 6-1959, p. 9.

*Primary Examiner*—Ralph S. Kendall
*Attorney, Agent, or Firm*—Graham S. Jones, II

[57] ABSTRACT

A layer of resist is applied to a metal substrate, and a matrix is formed in the resist. A metal or dielectric mask having overhanging upper edges is formed by electroplating metal into the resist matrix which has preformed openings for defining the mask. The resist matrix is then removed from the substrate. A film is then deposited upon the substrate, where it is exposed, and the mask with the overhanging upper edges protecting the side walls of the mask from being covered. Then a chemical, such as an etchant, is applied to the side walls of the mask to remove it, lifting off the material deposited upon it. The mask is made by plating metal through apertures or coating of tapered holes.

2 Claims, 31 Drawing Figures

HIGH TEMPERATURE LIFT-OFF TECHNIQUE

This is a continuation of application Ser. No. 645,852 filed Dec. 31, 1975, abandoned.

BACKGROUND OF THE INVENTION

Field of the Invention

This invention relates to coating processes and miscellaneous products, and, more particularly, to utilizing a masking coating. Coating is provided in a vacuum by sputtering or vacuum coating. This invention also relates to masks for deposition of thin films both by vacuum coating and sputtering on various substrates. The masks can be formed by electrodeposition, electroless deposition, or otherwise.

SUMMARY OF THE INVENTION

In accordance with this invention, a method is provided for producing a thin film structure by depositing a material in a vacuum. A matrix is applied to a substrate. A pattern of openings is formed in the matrix. Then a lift-off material is deposited in the openings in the matrix. The deposits have larger overhanging width at the top than at the bottom. Then, the remainder of the matrix is removed. Subsequently, a material is deposited in a vacuum upon the product of the previous step to a thickness substantially less than the first layer, so as to leave the sides of the lift-off material exposed.

Finally, the lift-off material and the coating material deposited upon it are removed by treating the product of the last step with a chemical solution effective to remove the lift-off material by etching or the like.

DESCRIPTION OF THE PREFERRED EMBODIMENT

A substrate 10 in FIGS. 1A–G is coated with a metal layer 11 of a material or layers of materials which can provide adhesion to substrate 10 and also serve as a plating base for electroplating.

When a metal such as Fe, Ni, Cr, or Cd is applied at an elevated temperature upon a substrate 10, both adhesion and a plating base are obtained without any requirement for an intermediate adhesion layer. However, if Au, Cu, Pd, or Pt is to be applied at any temperature or if Co or NiFe is to be applied at room temperature, as a plating base, then an intermediate adhesion layer of a reactive metal such as Ti, Ta, Al, or Cr is required to be applied to the substrate prior to application of the plating base.

Figure 1A:
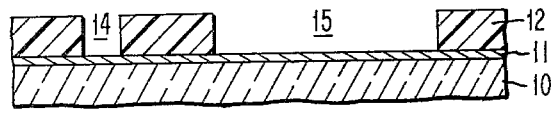
FIGS. 1A–LG show a first set of steps of producing a film by means of a lift-off process in accordance with this invention, with overhang provided by plating to a greater depth than resist thickness.
Figure 1B:
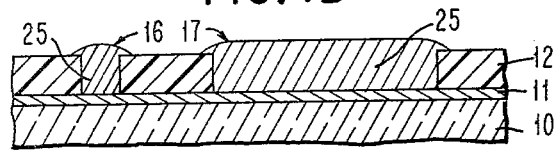

Upon the layer 11 is deposited a layer of radiation sensitive organic resist 12 which has been exposed using U.V., E-beam or X-ray radiation and developed previously to provide opening slots 14 and 15 which comprise lengthwise slots extending back towards the back of the substrate 10. Slots 14 and 15 are intended to form borders for a pattern such as an electrical lead or like thin straight edge pattern. In FIG. 1B, the slots 14 and 15 have been filled with electroplated layer 25 of metal forming elements 16 and 17 in the shape of stripes which have overhanging edges and caps that fill and extend beyond the slots 14 and 15 both vertically and horizontally. Note that slots 14 and 15 and thus elements 16 and 17 can be extremely wide or narrower if desired. For more satisfactory rates of removal of the material to be lifted from substrate 10 and layer 11 between FIGS. 1D and 1E as described below, it is desirable that the ratios of widths between narrow and broad areas to be lifted should be less than about 25:1. This helps to obtain uniform removal of layers 25 and 19 as shown between FIGS. 1D and 1E.

Figure 1C:
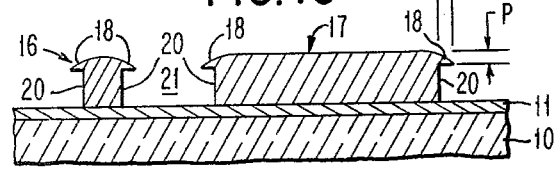
Figure 1D:
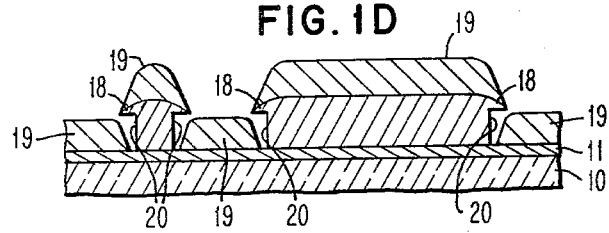

In FIG. 1C, the resist 12 has been removed to leave only the electroplated mask elements 16 and 17 which have overhanging edges 18. The resist is removed using conventional means such as organic solvents or exposure followed by development, plasma ashing or an organic stripping solution, etc. The electroplated metal must be deposited uniformly and the bath must have a good macro and micro throwing power. Throwing power measures the degree of uniformity of plating. Alternatively, electroless plating can be used. The electroplated metal must withstand primary pattern deposition temperature of from 50°–700° C. The electroplated pattern of elements 16 and 17 should have a uniform (about 0.1 $\mu$m to 5 $\mu$m) overhang (mushroom cap). The size of the overhang depends primarily upon the lateral and thickness dimensions of the final pattern designed to be obtained by this lift-off process. Note that the thickness of resist layer 12 is selected to be a minimum of about 20% thicker (or at least about 0.25 $\mu$m thicker when using thick films) than the desired thickness of the material to be deposited in the next step as shown by FIG. 1D. For very small geometries, the overhang (O) and the projection (P) shown in FIG. 1C of the plated material above the top plane of resist 12 will be about 5–10% of resist thickness, and the O and P should be substantially equal. After the resist 12 is removed, layer 11 can be removed where elements 16 and 17, etc. are absent by sputter etching, chemical etching, reactive plasma etching or reactive plasma sputter etching, or the like.

Figure 1E:
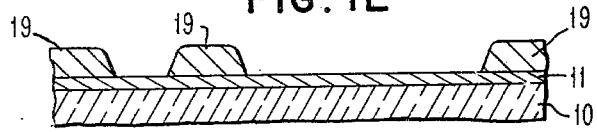

In FIG. 1D, the elements 16 and 17 are employed as vacuum coating masks for evaporation or sputtering of a layer of the ultimate coating material 19 such as a metal or dielectric which is deposited upon layer 11 and elements 16 and 17. The overhangs 18 leave the sides 20 of the elements 16 and 17 exposed without any substantial coating of the material 19. The electroplated metal forming elements 16 and 17 is selectively etched as shown in FIG. 1E chemically, electrochemically, or removed with reactive ion plasma, or using other means after deposition of the material 19 to form the primary pattern desired, with minimal attack upon the primary pattern. Thus, the undesired metal of elements 16 and 17 is "lifted off" the layer 11.

Figure 1F:
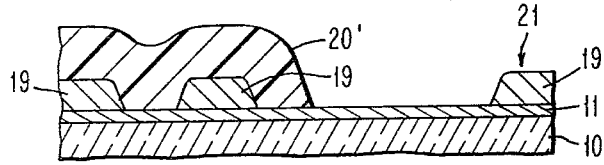
Figure 1G:
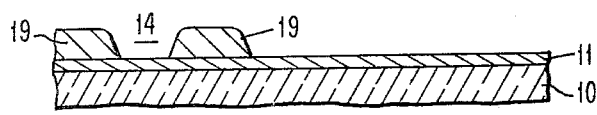

In cases in which narrow strips are to be formed, or where some of the material 19 is to be removed, there is deposited a layer 20' of resist which has been exposed as shown in FIG. 1F to leave portion 21 of material 19 exposed so that it can be removed as shown in FIG. 1G by a subtractive technique such as chemical etching or by any dry means such as sputter etching, reactive sputter etching, ion milling, plasma etching or any other suitable means.

By the way of example, the electroplated metals can be (a) Au, Pt, Pd, Ag, or (b) Cu, Zn, Ni, Co, Fe, Cr, Sn, W or any binary, ternary, or even quaternary alloy of any of the above elements or any of the above elements with any other element. The metals in group (a) are used primarily in case of lift-off in connection with the metallic or non-metallic patterns where the pattern formed is made of a more noble metal or a metal which can be selectively etched or destroyed by other means such as heating, chemical reaction, etc. Group (b) metals are more universal because they are less noble. They can be employed for lift-off masks for dielectrics and a variety of more noble metals.

Although only a few selected examples of structures are shown here, the technique can be used in fabricating all types of magnetic structures, all types of semiconducting structures such as integrated circuits, second level packaging, optical and electro-optical structures, and many others.

If it is a dielectric which forms the primary pattern 19, it may be desirable to introduce a metallization removal step (sputter etching, ion milling, plasma or chemical etching) prior to deposition of the primary pattern. Although the technique is very general and has a very broad range of applications, it is particularly useful in forming Schott glass, $SiO_2$, Si, Ti, or Cr laminated permalloy structures with very high frequency permeability for the use in inductive heads, MR head shields, and shields for other purposes, etc. In this situation, as shown in FIGS. 2A–2I, an electroplated structure can be a very narrow frame which is electroformed using a copper bath. In this case, although Cu can be selectively etched in the presence of Fe, NiFe, NiFeCr, NiFePd, etc. using ammonium persulfate, the final layer is Schott glass which provides additional protection of the primary structure.

If desired, the primary structure is deposited in such a way that the edges of the primary structure are sloping (tapered) thus being easy to insulate for step-over connections of leads in subsequent fabrication. This is accomplished by using sputter deposition rather than evaporating a relatively thick layer or evaporating while rocking the sample in an appropriate fashion.

Figure 2A:
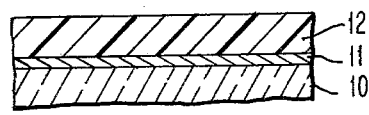
FIGS. 2A–2I show a second process in accordance with this invention similar to that of FIGS. 1A–1G.
Figure 2B:
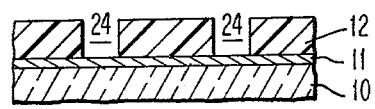

An alternative form of the process of this invention is shown in FIGS. 2A–2I using a dry process to produce Permalloy laminations, i.e., Permalloy/Schott glass/Permalloy with an inorganic frame. In FIG. 2A upon a glass substrate 10, a metallized film 11 carries a layer 12 of Shipley resist which is 1μ thicker than the ultimate laminations of Permalloy and glass. The resist is exposed to radiation and developed as shown in FIG. 2B yielding slots 24 which are 0.2 to 0.4μ wide in 4μ to 6μ thick resist 12, preferably.

Figure 2C:
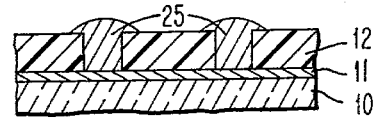
Figure 2D:
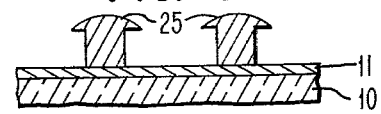

In FIG. 2C, the result of electroplating metal elements 25 into slots 24 is shown. The metal selected must be easily etched selectively in the presence of Permalloy. Copper is satisfactory and it can be etched with ammonium persulfate (high pH≈7–9) in which Ni-Fe is insoluble. Other metals such as Cr, Zn, Cd, and Sn also are suitable for plating. The metal is plated to a depth of about 3–7μ thick to form a mushroom shaped cross-section with an overhang of 0.25 to 3μ preferably. The resist is removed with a solvent (acetone for Shipley) to yield the result shown in FIG. 2D.

Figure 2E:
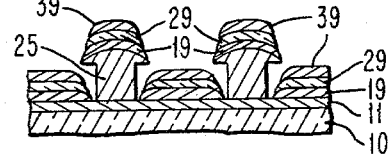

Then, in FIG. 2E the elements 25 and exposed surfaces 11 are shown coated with Permalloy layer 19, Schott glass layer 29, and Permalloy layer 39 to a 2 to 3μ thickness overall. Preferably, an additional layer of Schott glass (not shown) is deposited to protect the Permalloy layer 39 from attack. Various W, Cr, Pd, or Mo alloys with Permalloy and SiFe can also be used.

Sandwiches of laminations can be formed as shown in Table 1 below:

TABLE I

| W-Permalloy | Mo-Perm. | Pd-Perm. | 3–6% SiFe |
|---|---|---|---|
| $SiO_2$ or W | $SiO_2$ or W | $SiO_2$ or W | $SiO_2$ |
| W-Perm. | Mo-Perm. | Pd-Perm. | 3% SiFe |
| $SiO_2$ or W | $SiO_2$ or Mo | $SiO_2$ or Mo | $SiO_2$ |

Alternatively, Sendust (Si 9.6%, Fe 85%, Al 5.4% by weight) can be sputtered whether laminated or not.

Figure 2F:
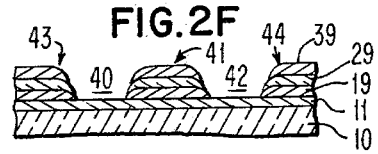

In FIG. 2F the result of etching away the elements 25 is shown with the Permalloy sandwich above them lifted off the substrate. When the elements are composed of copper, they are etched as stated above. With Zn ammonium sulfate is the etchant (pH≈7–9). When the elements 25 are composed of Cr, the etchant is $AlCl_3$ plus Zn or any other suitable Cr etchant.

Figure 2G:
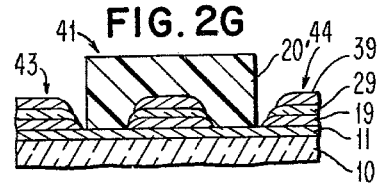

In FIG. 2G, Shipley resist 20' has been applied to cover slots 40 and 42 as well as strip 41 between them, in order to protect the Permalloy sandwich segment which will comprise the yoke of the head.

Figure 2H:
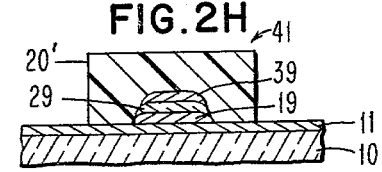
Figure 2I:
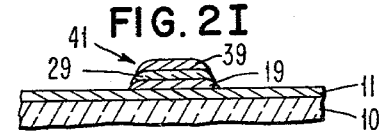

The sections 43 and 44 are removed by etching using $FeCl_3$ and HF separately or HF plus $FeCl_3$ mixture to yield the result of FIG. 2H. The resist is removed to yield the desired yoke structure in FIG. 2I, which comprises the primary pattern. There are situations where dummy structures need not be removed, since they do not exist or because they can remain without harming the product.

Groove with Sloping Sides

Figure 3A:
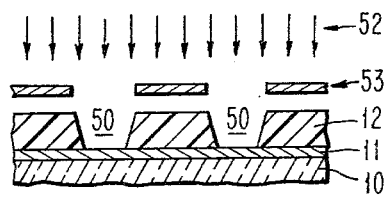
FIGS. 3A–3C show a third process in accordance with this invention, with tapered openings in resist forming overhang in the lift-off material.

Various techniques can be used to produce a pattern as in FIG. 3A with groove 50 having sloping sides as a result of shining radiation 52 through a mask 53 onto a positive resist. Resists which can be used include Shipley photoresist, KTFR, and PMMA. FIG. 3A is a typical showing of multiple steps from exposure to development.

In the case of PMMA, the pattern is obtained when radiation 52 is an electron beam of low intensity and development time is long and/or developer concentration is high. Metal 25 is deposited in FIG. 3B. Then, resist 12 is removed and metal 19 is vacuum deposited in FIG. 3C. Elements 25 are etched away in the usual way although that is not shown.

In negative working electron beam resists, such sloped edge patterns can be obtained by adjusting the electron beam intensity and the development time.

Figure 3B:
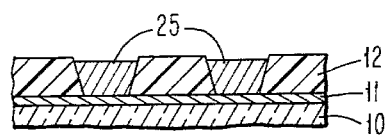
Figure 3C:
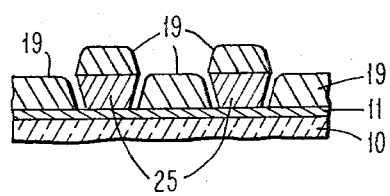
Figure 4A:
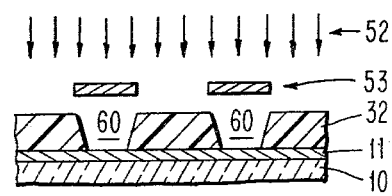
FIGS. 4A–4C show a third process in accordance with this invention, with tapered openings in resist forming overhang in the lift-off material.

In PMMA and PMMA copolymers, by suitable electron beam modulation (intensity) and suitable development, an exactly opposite slope can be obtained such as shown in FIG. 4A. As can be seen from the sketches, FIGS. 3B and 3C and FIGS. 4B and 4C, both sloping versions are useful in forming a suitable pattern to be used for forming an inorganic, high temperature mask used in the lift-off, producing slots 50 or 60.

In the case of Shipley resist or other positive working resists, sloping sides such as shown in FIG. 3A can be obtained by:
1. Defocussing or decollimating ultraviolet light.
2. Removing the mask from intimate contact with the resist.
3. Using very thick resist, i.e., thicker than about $2\mu$ even when the light beam is not defocussed or decollimated and even when the mask-to-resist contact is good.
4. Using a disperse (non-collimated) source of light.
5. Using any one or a combination of methods (1), (2) and/or (3) and (4) combined.

Figure 4B:
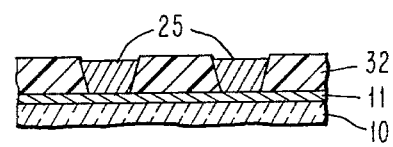
Figure 4C:
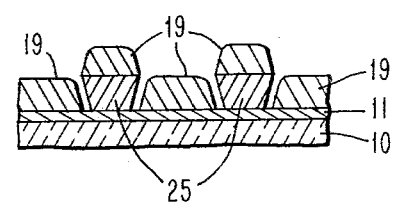
Figure 5A:
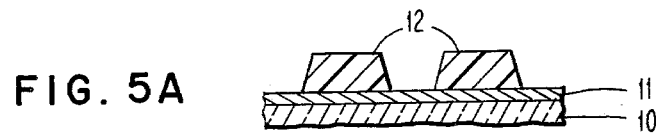
FIGS. 5A–5E show a process for producing improved overhang by heating a resist of the form used in FIGS. 3A, 4A and 5A to obtain curvature of the resist at edges, yielding a greater overhang.
Figure 5B:
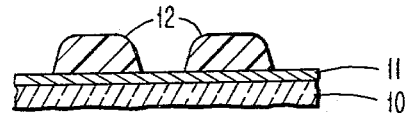
Figure 5C:
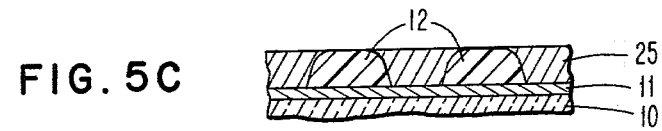
Figure 5D:
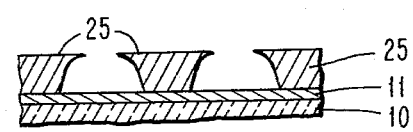
Figure 5E:
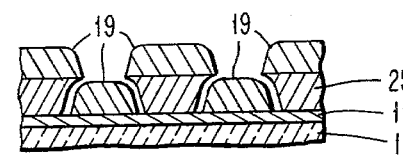

In the case of negative working resists such as KTFR, KOR (Eastman Kodak resists) as well as others, techniques (1) through (5) or any combination thereof can be used to form similarly sloping sides as in FIGS. 3B and 3C and in FIGS. 4B and 4C.

After such resist patterns with sloping edges are obtained, as in FIGS. 3A-3C and 4A-4C, the openings in the resist are filled by a suitable deposition means such as electroplating, electroless deposition, evaporation, sputtering, etc. The deposited metal 25 or material (dielectric) can be brought to within a thickness equal to about ⅔ of the desired final deposition layer to be produced by lifting or about $0.25\mu$ from the top in thick deposits. This metal (or dielectric), Cu, Zn, Sn, Al, etc., forms an inverted trapezoid as shown in FIGS. 3B and 4B. When the sloping sides are present, it is not necessary to continue to electrodeposit the metal or the dielectric 25 until a mushroom shape is formed over the resist. Depending on the shape of the inverted trapezoid 50 or 60, one may or may not need a mushroom-shaped pattern to accomplish the liftoff.

After removal of resist, the desired metal layer, dielectric laminate magnetic layer, or a dielectric layer is deposited by evaporation, ion gun plating, and/or sputtering, etc. The lifting-off process can now be accomplished as per FIGS. 2E-2I or FIGS. 1D-1G. The only necessary condition is that the choice of the inorganic lift-off material be such that it can be selectively dissolved, attacked or etched otherwise without attacking the final pattern desired to be formed by the high temperature lift-off process.

In the technique of FIGS. 5A-5E, the resist 12 (Shipley, KTFR, polymethylmethacralate (PMMA), PMMA copolymer or any other thermally deformable polymer) is shaped into patterns (as by exposure and development or by etching (reactive plasma, chemical, etc.). The pattern is subsequently heated to a temperature which is sufficiently high for the polymer 12 to flow (deform due to surface tension pull) and form shapes shown in FIG. 5B. For Shipley resist, this can be accomplished by rapid heating and cooling the sample to about 150° C. to 160° C. or by slow heating to about 100° C. to 130° C. and slow cooling (taking the time temperature product factor which makes Shipley resist still easily removable). Shipley resist is removable by use of conventional means such as acetone or exposure to U.V. light followed by development using conventional Shipley resist developers. It can be seen that the heating will produce the desired shape in the resist which is useful in producing sloping sides or even slight overhang in the inorganic mask, FIG. 5A. The remaining steps are discussed above for FIGS. 1B-1G or 2C-2I. The rounding of edges or sloping edges can be produced by short exposure of organic resists to reactive plasma and or sputter etching.

Figure 6A:
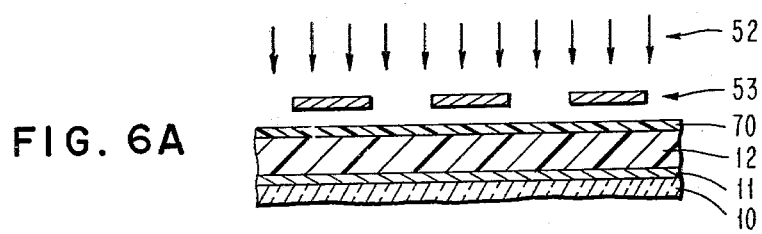
FIGS. 6A–6D show a two-resist technique of achieving overhang.
Figure 6B:
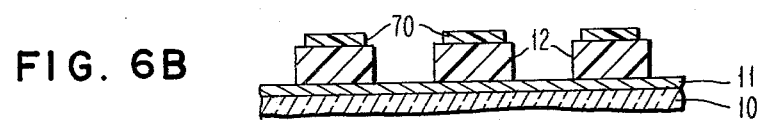
Figure 6C:
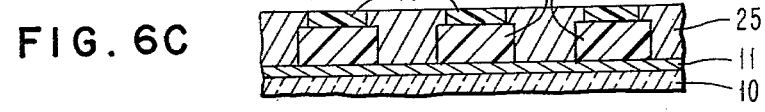
Figure 6D:
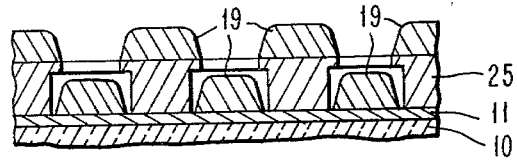

In the technique of FIGS. 6A-6D, two resists of two different sensitivities are used. The higher sensitivity resist 70, on top, is a positive working resist and on the bottom is the negative working resist 12. The bottom resist layer 12 is about 25% thicker than the thickness of the material to be formed by lift-off (see FIG. 6A). After the exposure to U.V. or E-beam or X-ray source and development, a shape shown in FIG. 6B is obtained. Upon electrodeposition or electroless deposition, an inorganic mask is formed with a well defined overhang as shown in FIG. 6C. In FIG. 6D material 19 is deposited after resist 12, 70 has been removed.

The remainder of the process is described above. Alternatively, negative working resist can be used with the more sensitive resist in layer 12 at the bottom.

It will be obvious to one skilled in the art that the above techniques can be used in combination with each other as well as in combination.

What is claimed is:
1. A method of forming a thin film structure by depositing a material in a vacuum including,
    (a) applying a resist upon a metallic substrate,
    (b) exposing said resist to radiation selectively and then developing to form patterns of openings in said resist, said resist being exposed and developed to provide tapered walls to said openings, and said openings having the largest cross-sectional area at the exterior surface thereof, said resist with openings comprising a thermally deformable material,
    (c) applying energy for heating said resist with openings to cause flow of the edges thereto to round said edges prior to depositing said lift-off material,
    (d) plating a metallic lift-off material into said openings to a thickness less than or equal to the thickness of said resist, said lift-off material forming shapes having larger overhanging width at the top of said openings than at the bottom thereof, with a substantial portion of said resist being free of any overhanging lift-off material,
    (e) removing the remainder of said resist,
    (f) depositing a metal film primary pattern coating material in a vacuum upon the product of step (e) to a thickness substantially less than the thickness of said resist layer, thereby leaving openings between said lift-off material and said coating material to the sides of said lift-off material wherein said metal film is more noble than said metallic lift-off material, and
    (g) removing said lift-off material by treating the product of step (f) with an etching solution effective to remove said lift-off material, leaving said more noble metal primary pattern coating material, with minimal attack upon said primary pattern coating material, whereby said lift-off material has an overhang when plated within said openings in step (d) for facilitating removal of the lift-off material in step (g).

2. A method of forming a thin film structure by depositing a material in a vacuum including,
    (a) applying a resist upon a metallic substrate,
    (b) exposing said resist to form patterns of openings in said resist having tapered walls having the inverse of an overhang, said resist with openings comprising a thermally deformable material, and then applying energy for heating said resist with openings to cause flow of the edges thereof to round said edges, (c) plating a lift-off material into said openings to a thickness less than the thickness of said resist forming shapes having larger overhanging width at the top of said openings than at the bottom thereof, whereby said lift-off material provides an overhang when deposited within said openings, (d) removing the remainder of said resist, (e) depositing a coating material in a vacuum upon the product of step (d) to a thickness substantially less than said first layer, leaving openings to the sides of said lift-off material, and (f) removing said lift-off material by treating the product of step (e) with a chemical solution to remove said lift-off material.

* * * * *